(12) United States Patent
Shelnutt et al.

(10) Patent No.: US 9,693,484 B2
(45) Date of Patent: Jun. 27, 2017

(54) APPARATUS AND METHOD FOR COOLING AN INFORMATION HANDLING SYSTEM

(71) Applicant: DELL PRODUCTS, L.P., Round Rock, TX (US)

(72) Inventors: Austin Michael Shelnutt, Leander, TX (US); Travis C. North, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 92 days.

(21) Appl. No.: 14/706,184

(22) Filed: May 7, 2015

(65) Prior Publication Data

US 2016/0330872 A1    Nov. 10, 2016

(51) Int. Cl.
    *H05K 7/20*    (2006.01)
(52) U.S. Cl.
    CPC ................... *H05K 7/20809* (2013.01)
(58) Field of Classification Search
    CPC .......... H05K 7/20809; H05K 7/20727; H05K 7/20154; G06F 2200/201
    USPC .......... 361/679.47, 679.52, 679.53, 695–704
    See application file for complete search history.

(56) References Cited

U.S. PATENT DOCUMENTS

| | | | | |
|---|---|---|---|---|
| 5,390,734 A | * | 2/1995 | Voorhes | F28F 13/00 165/185 |
| 2003/0051859 A1 | * | 3/2003 | Chesser | F28D 15/043 165/46 |
| 2006/0082971 A1 | | 4/2006 | Artman et al. | |
| 2006/0144568 A1 | * | 7/2006 | Crocker | H01L 23/473 165/104.33 |
| 2007/0035928 A1 | * | 2/2007 | Hamman | G06F 1/20 361/701 |
| 2007/0097640 A1 | * | 5/2007 | He | G06F 1/20 361/699 |
| 2007/0097642 A1 | | 5/2007 | Artman et al. | |
| 2008/0198551 A1 | | 8/2008 | Hoss et al. | |
| 2012/0106083 A1 | * | 5/2012 | Toftloekke | F28D 15/0266 361/698 |
| 2012/0137718 A1 | * | 6/2012 | Uchida | F28D 15/043 62/259.2 |
| 2013/0044433 A1 | | 2/2013 | Lee | |
| 2013/0168058 A1 | | 7/2013 | Chamseddine et al. | |
| 2015/0062802 A1 | | 3/2015 | Grunow et al. | |
| 2016/0029515 A1 | * | 1/2016 | Tansley | F25D 3/02 165/104.33 |
| 2016/0066472 A1 | * | 3/2016 | Cader | G06F 1/206 361/699 |

* cited by examiner

*Primary Examiner* — Anthony Haughton
*Assistant Examiner* — Yahya Ahmad
(74) *Attorney, Agent, or Firm* — Isidore PLLC

(57) ABSTRACT

An apparatus for cooling an information handling system has at least one component requiring cooling. The apparatus includes a heat reservoir configured to be coupled to a chassis of the information handling system containing the component requiring cooling. A fluid reservoir is defined within the heat reservoir. A thermal fluid is disposed within the heat reservoir. A thermal conduit has a first end and a second end. The first end of the thermal conduit is coupled to the heat reservoir such that the thermal conduit is in thermal communication with the thermal fluid and the second end is coupled to the component requiring cooling such that the thermal conduit is in thermal communication with the component requiring cooling.

20 Claims, 5 Drawing Sheets

APPARATUS AND METHOD FOR COOLING AN INFORMATION HANDLING SYSTEM

BACKGROUND

1. Technical Field

The present disclosure generally relates to cooling of electronic devices and in particular to cooling an information handling system.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

During operation, the electronic hardware components of the information handling system generate heat. In order for the information handling system to properly function, the electronic components are required to remain below a certain temperature during operation. Various devices are known for removing heat from electronic components. For example, fans and heat sinks have been used to cool the components of information handling systems. Information handling systems have as the primary cooling device of the heat producing components an air-cooled heat sink or liquid cooled cold plate where the cooling fluid has an end heat rejection site that is outside the boundaries of the information handling system. Conventional computer heat sinks use air that captures heat from the components and processor and rejects the heat outside of the information handling system to the surrounding environment. An ongoing need exists for improved cooling of components within information handling systems.

BRIEF SUMMARY

Disclosed is an information handling system, an apparatus and a method for cooling components within an information handling system.

According to one embodiment, an information handling system has at least one component to be cooled. The information handling system includes a heat reservoir configured to be coupled to (or provided as a component part of) a chassis of the information handling system containing the component requiring cooling. A fluid reservoir is defined within the heat reservoir. A thermal fluid is disposed within the reservoir. A thermal conduit is provided having a first end and a second end. The first end of the thermal conduit is thermally coupled to the heat reservoir such that the thermal conduit is in thermal communication with the thermal fluid, and the second end is thermally coupled to the component requiring cooling such that the thermal conduit is in thermal communication with the component requiring cooling.

According to another embodiment, an apparatus for cooling an information handling system has at least one component requiring cooling. The apparatus includes a heat reservoir configured to be coupled to a chassis of the information handling system containing the component requiring cooling. A fluid reservoir is defined within the heat reservoir. A thermal fluid is disposed within the reservoir. A thermal conduit is provided having a first end and a second end. The first end of the thermal conduit is thermally coupled to the heat reservoir such that the thermal conduit is in thermal communication with the thermal fluid and the second end is thermally coupled to the component requiring cooling such that the thermal conduit is in thermal communication with the component requiring cooling.

According to one embodiment, a method of cooling an information handling system is disclosed. The information handling system has a chassis and at least one processor mounted to a motherboard. The method includes providing a heat reservoir having a fluid reservoir filled with a thermal fluid. The method further includes providing a thermal conduit. The first end of the thermal conduit is thermally coupled to the heat reservoir such that the thermal conduit is in thermal communication with the thermal fluid. A second end of the thermal conduit is thermally coupled to a heat sink. The motherboard is mounted in the chassis. The heat reservoir is attached to the chassis and the heat sink is attached to the processor.

In an embodiment, a heat reservoir is a transient heat reservoir where heat (energy) may be stored temporarily during periods of extreme processor usage and/or external cooling fluid failure. For example, the cooling vent of a laptop computer is blocked or plugged by a leg. The heat reservoir can cool the component or processor by storing excess heat up to its capacity, but once the heat reservoir reaches its maximum heat storage capacity (as dictated by its thermal mass) it can no longer absorb anymore heat until the heat reservoir dissipates heat back through the original component's primary cooling device (i.e. processor and heat sink). When the processor experiences a reduction of usage or a surplus of primary cooling availability, the heat reservoir will transfer heat back to the processor and heat sink.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements.

Embodiments incorporating teachings of the present disclosure are shown and described with respect to the figures presented herein, in which.

DETAILED DESCRIPTION

The illustrative embodiments provide an apparatus, an information handling system and a method for conductive cooling of components within an information handling system.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Figure 1:
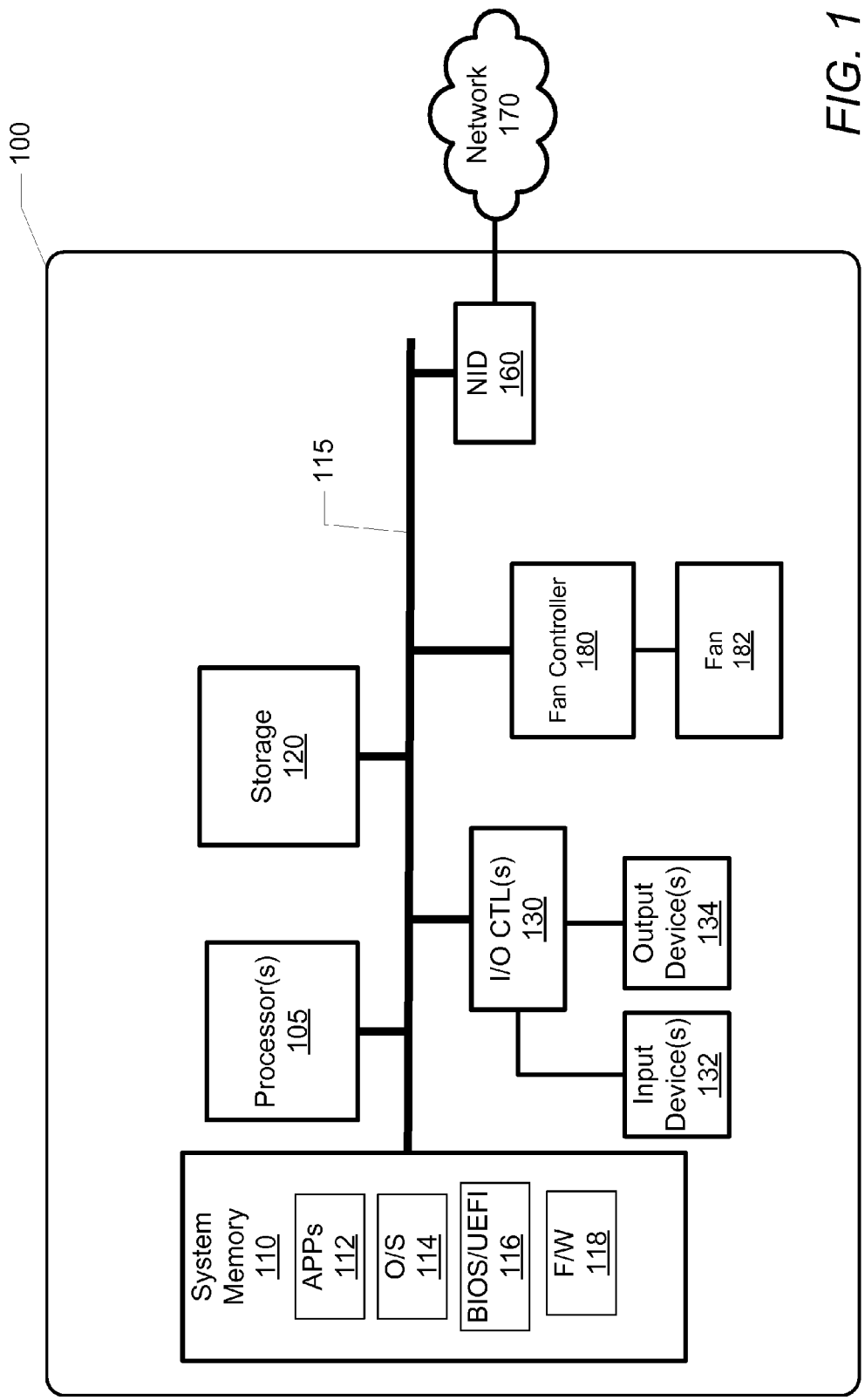
FIG. 1 illustrates an example block diagram of an information handling system within which various aspects of the disclosure can be implemented, according to one or more embodiments.

FIG. 1 illustrates a block diagram representation of an example information handling system (IHS) 100, within which one or more of the described features of the various embodiments of the disclosure can be implemented. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, example IHS 100 includes processor(s) 105 coupled to system memory 110 via system interconnect 115. System interconnect 115 can be interchangeably referred to as a system bus, in one or more embodiments. Also coupled to system interconnect 115 is storage 120 within which can be stored one or more software and/or firmware modules and/or data (not specifically shown). In one embodiment, storage 120 can be a hard drive or a solid state drive. The one or more software and/or firmware modules within storage 120 can be loaded into system memory 110 during operation of IHS 100. As shown, system memory 110 can include therein a plurality of software and/or firmware modules including application(s) 112, operating system (O/S) 114, basic input/output system (BIOS) 116 and firmware (F/W) 118.

In one or more embodiments, BIOS 116 comprises additional functionality associated with unified extensible firmware interface (UEFI), and can be more completely referred to as BIOS/UEFI in these embodiments. The various software and/or firmware modules have varying functionality when their corresponding program code is executed by processor(s) 105 or other processing devices within IHS 100.

IHS 100 further includes one or more input/output (I/O) controllers 130 which support connection by, and processing of signals from, one or more connected input device(s) 132, such as a keyboard, mouse, touch screen, or microphone. I/O controllers 130 also support connection to and forwarding of output signals to one or more connected output device(s) 134, such as a monitor or display device or audio speaker(s) or light emitting diodes (LEDs).

Additionally, in one or more embodiments, IHS 100 includes one or more fans 182 for cooling the components of IHS 100 such as processor(s) 105. IHS 100 can also include structures such as ducts within IHS 100 for directing the cooling air from fan 182 to locations within IHS 100. IHS 100 further includes a fan controller 180 that is connected to fan 182. Fan controller 180 is communicatively coupled with processor(s) 105 via system interconnect 115. Fan controller 180 can at least partially control the operation of fan 182.

IHS 100 further comprises a network interface device (NID) 160. NID 160 enables IHS 100 to communicate and/or interface with other devices, services, and components that are located external to IHS 100. These devices, services, and components can interface with IHS 100 via an external network, such as example network 170, using one or more communication protocols. In one embodiment, a customer provisioned system/platform can comprise multiple devices located across a distributed network, and NID 160 enables IHS 100 to be connected to these other devices. Network 170 can be a local area network, wide area network, personal area network, and the like, and the connection to and/or between network 170 and IHS 100 can be wired or wireless or a combination thereof. For purposes of discussion, network 170 is indicated as a single collective component for simplicity. However, it is appreciated that network 170 can comprise one or more direct connections to other devices as well as a more complex set of interconnections as can exist within a wide area network, such as the Internet.

Those of ordinary skill in the art will appreciate that the hardware components and basic configuration depicted in FIG. 1 and described herein may vary. For example, the illustrative components within IHS 100 are not intended to be exhaustive, but rather are representative to highlight components that can be utilized to implement aspects of the present disclosure. For example, other devices/components may be used in addition to or in place of the hardware depicted. The depicted example does not convey or imply any architectural or other limitations with respect to the presently described embodiments and/or the general disclosure.

Figure 2:
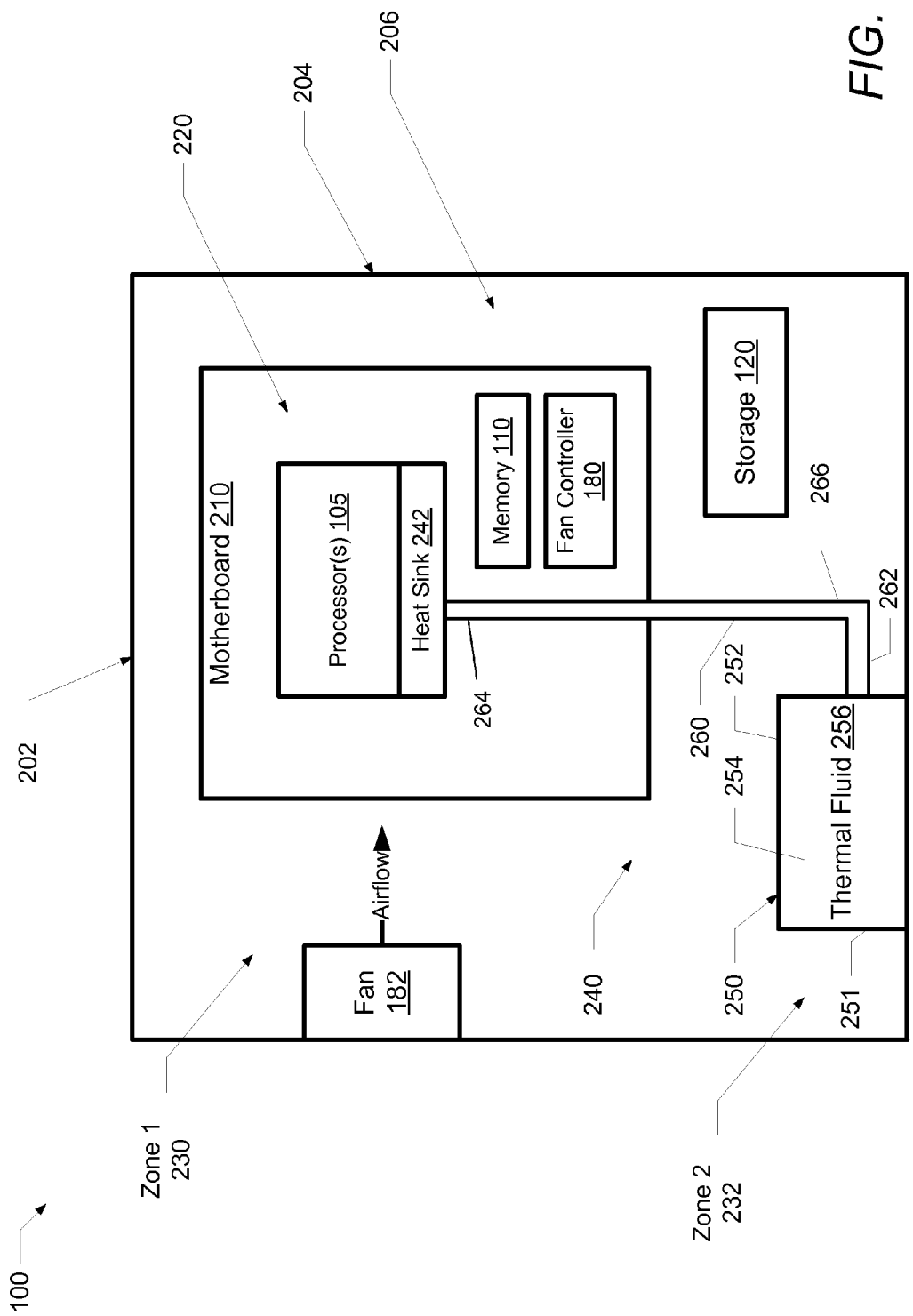
FIG. 2 illustrates an overall view of a physical implementation of an information handling system, in accordance with one embodiment.

With reference now to FIG. 2, there is illustrated one embodiment of a physical implementation of the components of IHS 100. In the description of FIG. 2, reference will also be made to FIG. 1. IHS 100 includes a chassis or housing 202 that contains the components of IHS 100. In one embodiment chassis 202 can contain a single IHS. In another embodiment, chassis 202 can be a rack that holds several IHSes. Chassis 202 is formed from several interconnected walls 204 that define and enclose an interior cavity or space 206. A motherboard 210 is mounted in chassis 202. Motherboard 210 is a printed circuit board that contains several components 220 of IHS 100. At least one of the components 220 is required to be cooled. Components 220 mounted to motherboard 210 include processor(s) 105, memory 110 and fan controller 180. Other components 220 can also be mounted to motherboard 210. Storage devices 120 and fan 182 are also mounted to chassis 202 within enclosed space 206.

Chassis 202 can include one or more air flow zones within enclosed space 206 of chassis 202, such as zone 1 230 and zone 2 232. While two air flow zones are shown in FIG. 2, IHS 100 can include only one air flow zone or can include more than two air flow zones. Zone 1 230 is characterized as being in an area of enclosed space 206 where airflow is at a maximum rate and not restricted. The airflow in zone 1 230 is high because of the location near fan 182 and the location of components of IHS 100 in zone 1 230. Zone 2 232 is characterized as being in an area of enclosed space 206 where airflow is minimal or restricted. The airflow in zone 2 232 is low because of the location away from fan 182 and the location of components of IHS 100 in zone 2 232 that block airflow.

A heat sink 242 is attached to processor(s) 105. Heat sink 242 is a heat exchanger that cools processor(s) 105 by dissipating heat into the surrounding air. Heat sinks are used where the heat dissipation ability of the basic device alone is insufficient to moderate its temperature.

Cooling apparatus 240 is provided within chassis 202. Cooling apparatus 240 includes a heat reservoir 250 mounted to chassis 202 within enclosed space 206. Heat reservoir 250 includes an outer shell or housing 251 formed from interconnected walls 252. Walls 252 define an interior thermal or fluid chamber 254 that contains a thermal fluid 256. Heat reservoir 250 can have a wide variety of three dimensional shapes. For example, heat reservoir 250 can be square, rectangular, oval, round, or irregular shaped. In one embodiment, heat reservoir 250 can be shaped to conform to an available space within enclosed space 206. Heat reservoir 250 can be formed from a variety of high thermal conductivity materials, such as but not limited to heat conducting materials such as aluminum or copper alloys. Thermal fluid 256 can be a variety of fluids including water or a phase change material, such as but not limited to sodium sulfate or lauric acid. In one embodiment, thermal fluid 256 can be a fluid with 'high caloric density' which references the amount of heat a material can absorb per unit of volume or space. For example, by volume, a gallon of water can absorb the same amount of heat as 4000 gallons of air. This property is called caloric density and has units of $J/(m^3*K)$ where J is energy (heat) in Joules, $m^3$ is volume in cubic meters, and K is the temperature change in units of Kelvin.

A thermal conduit 260 has a first end 262 that is thermally coupled to heat reservoir 250, a second end 264 that is thermally coupled to heat sink 242 and a middle section 266 extending between both ends 262 and 264. In one embodiment, thermal conduit 260 can be directly coupled to the processor(s) 105 or it can share contact with the heat sink 242. In another embodiment, thermal conduit 260 can be located between the processor(s) 105 and heat sink 242 or it can be embedded into the heat sink 242. In one embodiment, thermal conduit 260 can be a heat pipe. A heat pipe is a heat-transfer device that combines the principles of both thermal conductivity and phase transition to manage the transfer of heat between two interfaces, in this example between heat sink 242 and heat reservoir 250. First end 262 is thermally coupled to heat reservoir 250 such that the thermal conduit 260 is in thermal communication with the thermal fluid 256, and the second end 264 is thermally coupled to the heat sink 242 such that the thermal conduit 260 is in thermal communication with the component requiring cooling (i.e. processor(s) 105). As provided herein, the term thermally coupled refers to the placement or location of the specific end of the thermal conduit 260 proximate/adjacent to, in direct physical contact with, or inside of the component from/to which heat transfer is desired. In thermal communication, heat is conductively transferred between two devices from the high temperature device to the low temperature device across a temperature gradient. Thermal conduit 260 can be formed from a variety of materials that support or enable heat conduction, including but not limited to aluminum or copper alloys. While a single thermal conduit 260 is shown in FIG. 2, two or more thermal conduits 260 can be used.

In one embodiment, heat reservoir 250 can be located in zone 2 232 with little airflow. In another embodiment, heat reservoir 250 can be located in an area or zone within chassis 202 that has absolutely zero airflow or fully restricted airflow access.

Figure 3:
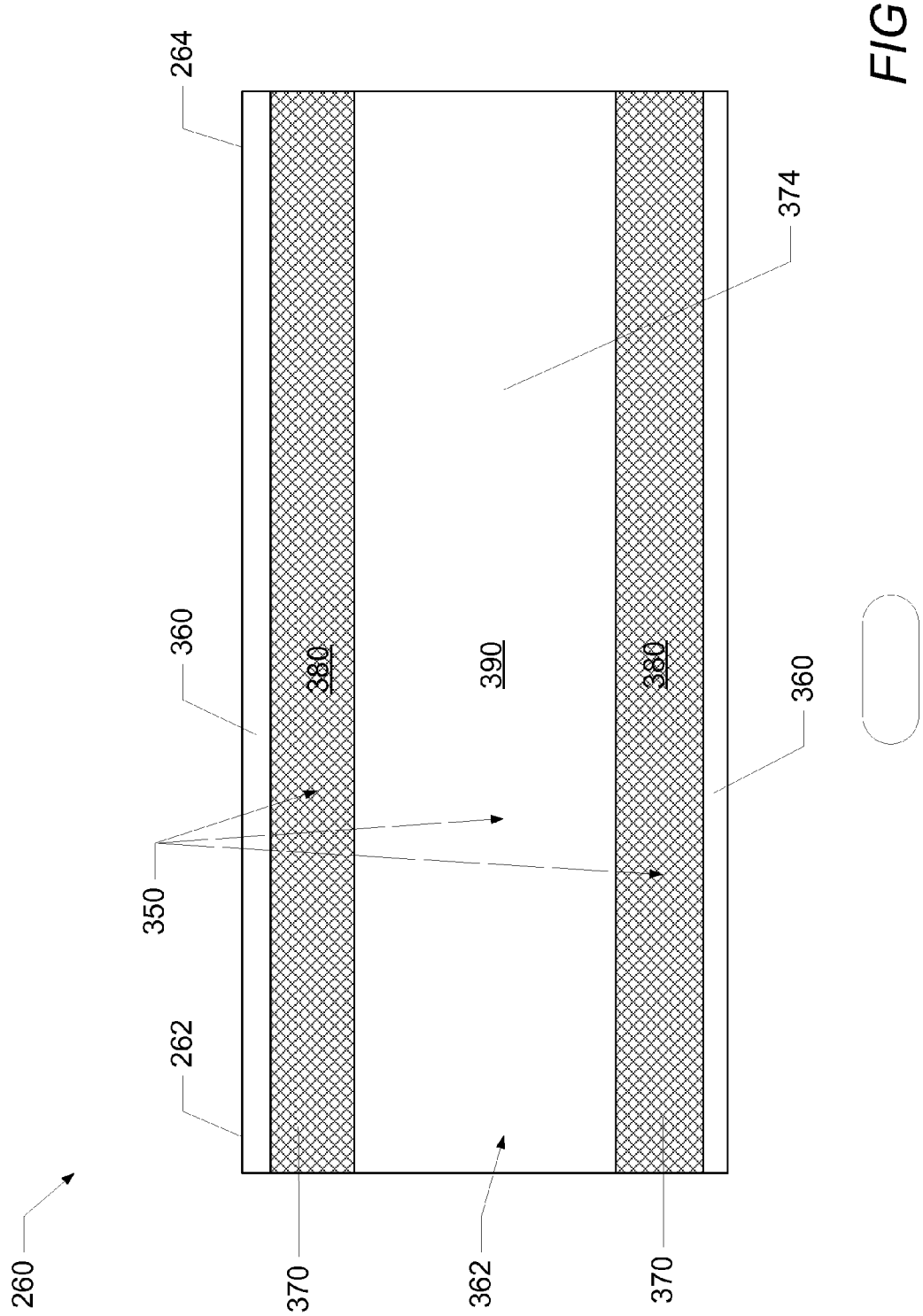
FIG. 3 is an enlarged view of a cooling apparatus, according to one or more embodiments.

FIG. 3 illustrates additional details of thermal conduit 260. Thermal conduit 260 has an outer wall 360 that defines an inner bore 362. A tube 370 of wicking material or copper particles is mounted in bore 362. Tube 370 can be formed from suitable materials such as sintered metals or metal screens of aluminum or copper alloys. Outer wall 360 and tube 370 define an inner lumen 374. Inner lumen 374 is surrounded by tube 370. Working fluid 350 fills both tube 370 and inner lumen 374. During assembly, a partial vacuum is drawn on inner bore 362 such that the pressure within thermal conduit 260 is less than atmospheric pressure.

During operation, when heat sink 242 is at a higher temperature than the heat reservoir 250, condensed liquid 380 of working fluid 350 that is saturated throughout tube 370 will evaporate into vapor 390 at second end 264 (see FIG. 2). As condensed liquid 380 evaporates, the vapor acquires heat. The vapor 390 diffuses along the length of inner lumen 374 to first end 262. At first end 262, the vapor 390 condenses back to condensed liquid 380. Heating the 'evaporator' region at second end 264 causes the working fluid 350 to evaporate and due to the fact that vapor has much lower density (takes up more space) the pressure build-up forces the vapor to expand to the opposing first end 262 of the thermal conduit 260 where it can condense back into saturated or condensed liquid 380. The saturated liquid is brought back to the evaporator region due to wicking action along the tube 370 caused by the wicking material or bonded particles on the interior surface of outer wall 360.

Thermal conduit 260 is a closed evaporator-condenser system that is sealed and lined with a capillary structure or wick. A working fluid, with substantial vapor pressure at the desired operating temperature, saturates the pores of the wick in a state of equilibrium between liquid and vapor. When heat is applied to the thermal conduit, the liquid in the wick heats up and evaporates. As the evaporating fluid fills the heat pipe's hollow center, the vapor diffuses throughout the length of the pipe. Condensation of the vapor occurs wherever the temperature is below that of the evaporation end. As it condenses, the vapor gives up the heat it acquired during evaporation. This effective high thermal conductance helps maintain near constant temperatures along the entire length of thermal conduit 260.

Figure 4:
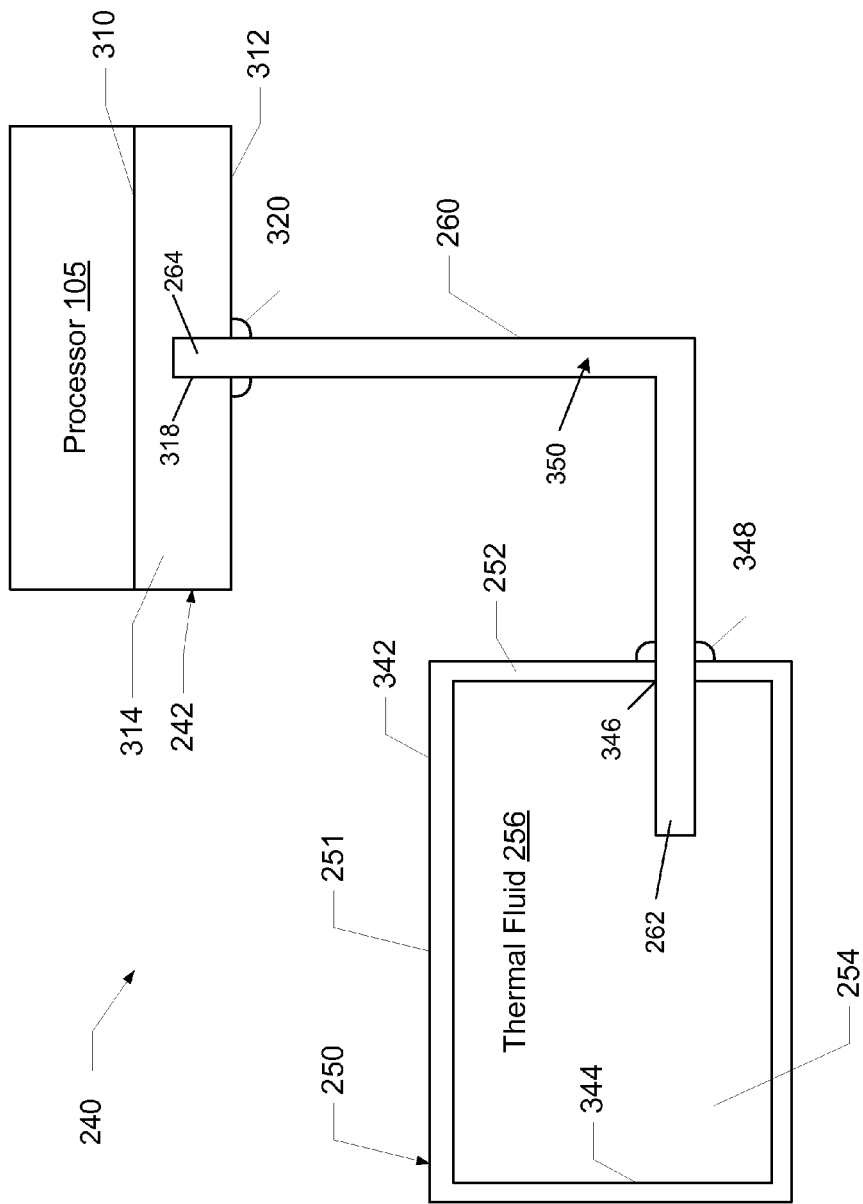
FIG. 4 is a cross-sectional view of a thermal conduit, according to one or more embodiments.

FIG. 4 illustrates additional details of cooling apparatus 240. Heat reservoir 250 has a housing 251, a chamber 254, an outer surface 342 and an inner surface 344. An opening 346 is defined in one of walls 252 and extends through wall 252. First end 262 of heat pipe 260 can extend through opening 346 such that first end 262 extends partially into chamber 254 where the first end 262 is surrounded by thermal fluid 256. In this embodiment, first end 262 is attached to wall 252 by braze joint 348. Braze joint 348 can be formed from a variety of materials such as but not limited to aluminum or copper alloys. In another embodiment, first end 262 can extend along and be attached to the outer surface of wall 252.

Heat sink 242 has an interior surface 310 coupled to processor(s) 105, an exterior surface 312 and a core 314. An opening or bore 318 extends from the exterior surface 312 into core 314. Second end 264 of thermal conduit 260 can extend into and be seated in bore 318 such that second end 264 is surrounded by core 314. Second end 264 can be attached to exterior surface 312 by braze joint 320. Braze joint 320 can be formed from a variety of materials such as but not limited to aluminum or copper alloys. In another embodiment, second end 264 can extend along and be attached to the exterior surface 312 of heat sink 242.

Thermal conduit 260 provides heat transfer whenever there is a temperature gradient (i.e., one end of thermal conduit 260 having a higher temperature than the other end). For example, during processor operation, the heat sink 242 receives a large amount of heat from processor and thus has a higher temperature relative to the temperature of thermal fluid 256. Thermal conduit 260 thus provides conduction of heat from higher temperature heat sink 242 to lower temperature thermal fluid 256.

In one embodiment, thermal conduit 260 is filled with a working fluid 350. Working fluid 350 can be a wide variety of materials such as water, ammonia or 1,1,1,2 tetrafluroethane, for example. During operation, working fluid 350 evaporates at one of end 262 or 264 that has a higher temperature and condenses at the other one of end 262 or 264 having the lower temperature.

In one embodiment, heat reservoir 250 is not cooled by an air mover or other cooling device. Heat reservoir 250 is cooled by transporting heat back through heat conduit 260 to heat sink 242 and/or the attached component (i.e., processor(s) 105) after the temperature gradient reverses. For example, when a high processor utilization application is first started, the heat reservoir 250 will be at a lower temperature than the processor and/or heat sink so this gradient will cause heat to flow from the processor(s) 105 to the heat reservoir 250 until the heat reservoir 250 reaches the same temperature as the processor(s) 105. If the temperature is the same there is no flow of heat. Once the high processor utilization stress application is stopped, the processor and heat sink will then begin to cool down. The heat reservoir 250 will then transfer heat through thermal conduit 250 back to the processor(s) 105 and heat sink 242 until it has fully dissipated its heat content and both the processor and the heat reservoir are, once again, at the same temperature.

According to one embodiment, heat flow between heat sink 242 and heat reservoir 250 through the thermal conduit 260 is bi-directional, depending on the direction of the temperature gradient (from high temperature to low temperature). When heat sink 242 is at a higher temperature than the working fluid 350 in heat reservoir 250, heat will be moved or transported from heat sink 342 through the thermal conduit 260 to the heat reservoir 250. The heat is transferred into thermal fluid 256. This heat transfer causes the temperature of the heat sink 342 to decrease and the temperature of the thermal fluid 256 to increase. In embodiments where thermal conduit includes working fluid 350, working fluid 350 evaporates at second end 264 and condenses at first end 262 when the high temperature at the second end 264 and the lower temperature at the first end 262 are at or above the boiling point and at or below the condensation point, respectively, of working fluid 350. Conversely, when the thermal fluid 256 and heat reservoir 250 are at a higher temperature than heat sink 242, heat will be moved or transported from the thermal fluid 256 and heat reservoir 250 through the thermal conduit 260 to the heat sink 242 and processor(s) 105 causing the temperature of the heat sink 342 and by extension the temperature of the processor(s) 105 to increase and the temperature of the thermal fluid 256 to decrease. With the embodiment that includes working fluid 350, working fluid 350 will evaporate at first end 262 and condense at second end 264. It is appreciated that this reverse direction of heat exchange form the working fluid to the processor(s) 105 can be utilized during IHS startup in colder climatic conditions, where the ambient temperature of the processor falls below the ideal operating lower temperature for the processor.

In one embodiment, thermal conduit 260 can be open-ended at first end 262 and the working fluid inside of the thermal conduit can be the same shared thermal fluid 256 as contained within heat reservoir 250. This heat transfer mechanism is called a thermo siphon. In another embodiment, heat reservoir 250 can share or be in contact with the processor(s) 105 or the surface of heat sink 242 or can be located between the processor and the heat sink base. In yet another embodiment, heat reservoir 250 can be directly attached to the heat sink itself.

Heat reservoir 250 is a transient heat reservoir where heat (energy) may be stored temporarily during periods of extreme processor usage and/or external cooling fluid failure. For example, the cooling vent of a laptop computer is blocked or plugged by a leg. Heat reservoir 250 can cool the component or processor by storing excess heat up to its capacity, but once heat reservoir 250 reaches its maximum heat storage capacity (as dictated by its thermal mass) it can no longer absorb anymore heat until heat reservoir 250 dissipates heat back through the original component's primary cooling device (i.e., processor and heat sink). When the processor experiences a reduction of usage or a surplus of primary cooling availability, the heat reservoir 250 will transfer heat back to the processor and heat sink.

Figure 5:
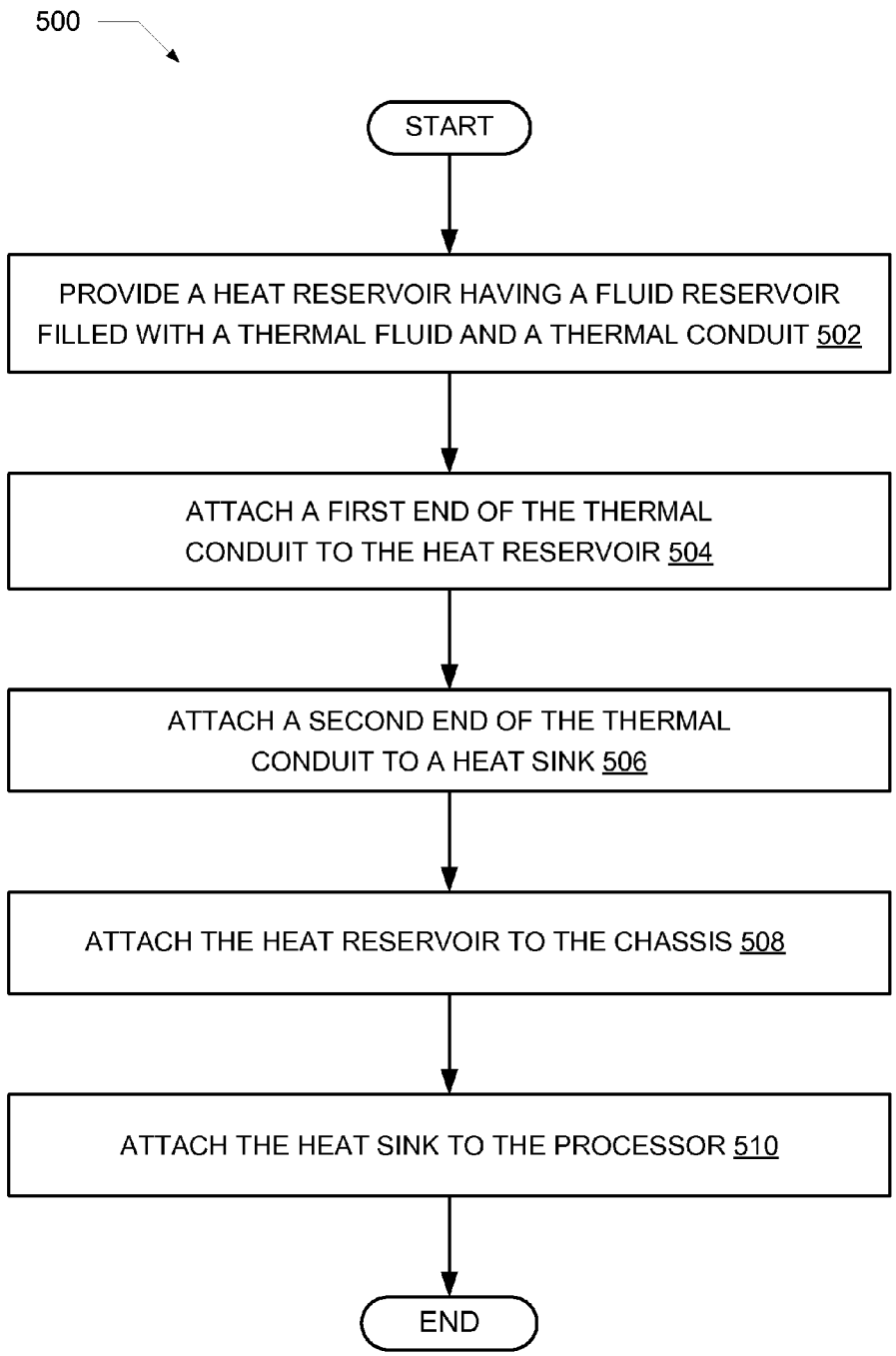
FIG. 5 is a flow chart illustrating an example of a method for manufacturing an information handling system having a cooling apparatus, according to one or more embodiments.

FIG. 5 illustrates a flowchart of an exemplary method 500 by which cooling apparatus 240 within the preceding figures can be manufactured. The description of method 500 is provided with general reference to the specific components illustrated within the preceding FIGS. 1-4. As a preliminary aspect of the manufacture of the IHS, motherboard 210 is placed in enclosed space 206 and mounted to chassis 202. Motherboard 210 can be attached to chassis 202 using fasteners.

With specific reference to FIG. 5, method 500 begins at the start block and proceeds to block 502 where a heat reservoir 250 having a fluid chamber 254 filled with a thermal fluid 256 and a thermal conduit 260 are provided for use in cooling a processor 105 configured with a heat sink 242 within an IHS chassis. The first end 262 of the thermal conduit 260 is thermally coupled or attached to the heat reservoir 250 such that the thermal conduit 260 is in thermal communication with the thermal fluid 256 (block 504). In one embodiment, first end 262 is attached to wall 252 by brazing braze joint 348. The second end 264 of the thermal conduit 260 is thermally coupled or attached to the heat sink 242 such that the thermal conduit 260 is in thermal communication with the heat sink 242 (block 506). Second end 264 is attached to outer surface 312 by brazing braze joint 320.

The heat reservoir 250 is attached to chassis 202 (block 508). Heat reservoir 250 can be attached to chassis 202 using fasteners. The heat sink 242 is thermally coupled to processor(s) 105 (block 510). Heat sink 242 can be coupled to processor(s) 105 by various means such as fasteners, clips, retainers and thermal adhesives. Method 500 then ends.

In some implementations, certain steps of the above flow chart methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entire hardware embodiment or an embodiment combining software (including firmware, resident software, microcode, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An information handling system having at least one component requiring cooling, the information handling system comprising:
    a heat reservoir configured to be coupled to a chassis of the information handling system containing the component requiring cooling;
    a fluid chamber defined within the heat reservoir;
    a thermal fluid disposed within the chamber; and
    a thermal conduit having a first end and a second end and an outer wall extending between the first and second end and defining an inner bore, the first end of the thermal conduit thermally coupled to the heat reservoir such that the thermal conduit is in thermal communication with the thermal fluid within the reservoir and the second end thermally coupled to the component requiring cooling such that the thermal conduit is in thermal communication with the component requiring cooling, wherein the thermal conduit provides heat transfer across a temperature gradient via a working fluid disposed within the inner bore.

2. The information handling system of claim 1, wherein the at least one component is a processor device having a processor and a heat sink thermally coupled to the processor; and wherein the second end of the thermal conduit is thermally coupled to at least one of the processor and the heat sink enabling the thermal conduit to provide heat transfer across a temperature gradient between the processor/heat sink and the thermal fluid.

3. The information handling system of claim 2, wherein the first end of the thermal conduit extends into the heat reservoir and is at least partially surrounded by the thermal fluid.

4. The information handling system of claim 2, wherein the second end of the thermal conduit extends into the heat sink.

5. The information handling system of claim 1, wherein the thermal fluid is water.

6. The information handling system of claim 1, wherein the thermal fluid is a phase change material and the thermal conduit is a heat pipe filled with the working fluid which evaporates at the end having the higher temperature and condenses at the end having the lower temperature.

7. The information handling system of claim 1, wherein the heat reservoir is mounted in an area of the chassis where airflow is restricted.

8. The information handling system of claim 1, wherein heat flow between the component requiring cooling and the heat reservoir through the thermal conduit is bi-directional, wherein when the component requiring cooling is at a higher temperature than the heat reservoir, heat will be transported from the component requiring cooling through the thermal conduit to the heat reservoir and when the heat reservoir is at a higher temperature than the component requiring cooling, heat will be transported from the heat reservoir through the thermal conduit to the component requiring cooling.

9. The information handling system of claim 1, wherein the thermal conduit comprises a tube of wicking material mounted to an inside of the outer wall, wherein the working fluid fills both the tube and the inner bore.

10. The information handling system of claim 9, wherein the tube of the wicking material is formed from one or more of sintered metals and metal screens of aluminum or copper alloys.

11. An apparatus for cooling an information handling system having at least one component requiring cooling, the apparatus comprising:
    a heat reservoir configured to be coupled to a chassis of the information handling system containing the component requiring cooling;
    a fluid chamber defined within the heat reservoir;
    a thermal fluid disposed within the fluid chamber; and
    a thermal conduit having a first end and a second end and an outer wall extending between the first and second end and defining an inner bore, the first end of the thermal conduit thermally coupled to the heat reservoir such that the thermal conduit is in thermal communication with the thermal fluid within the reservoir and the second end thermally coupled to the component requiring cooling such that the thermal conduit is in thermal communication with the component requiring cooling, wherein the thermal conduit provides heat transfer across a temperature gradient via a working fluid disposed within the inner bore.

12. The apparatus of claim 11, wherein the at least one component is a processor device having a processor and a heat sink coupled to the processor; and wherein the second end of the thermal conduit is thermally coupled to at least one of the processor and the heat sink, the thermal conduit providing heat transfer across a temperature gradient.

13. The apparatus of claim 12, wherein the first end of the thermal conduit extends into the heat reservoir and is at least partially surrounded by the thermal fluid and the second end of the thermal conduit extends into the heat sink.

14. The apparatus of claim 11, wherein the thermal fluid is water.

15. The apparatus of claim 11, wherein the thermal fluid is a phase change material and the thermal conduit is a heat pipe filled with the working fluid which evaporates at the second end and condenses at the first end.

16. The apparatus of claim 11, wherein the heat reservoir is mounted in an area of the chassis where airflow is restricted.

17. The apparatus of claim 11, wherein heat flow between the component requiring cooling and the heat reservoir through the thermal conduit is bi-directional, wherein when the component requiring cooling is at a higher temperature than the heat reservoir, heat will be transported from the component requiring cooling through the thermal conduit to the heat reservoir and when the heat reservoir is at a higher temperature than the component requiring cooling, heat will be transported from the heat reservoir through the thermal conduit to the component requiring cooling.

18. A method of cooling an information handling system having a chassis and at least one processor mounted to a motherboard, the method comprising:

providing a heat reservoir having a fluid reservoir filled with a thermal fluid;

providing a thermal conduit having a first end and a second end and an outer wall extending between the first and second end and defining an inner bore;

thermally coupling the first end of the thermal conduit to the heat reservoir such that the thermal conduit is in thermal communication with the thermal fluid, wherein the thermal conduit includes a working fluid disposed within the inner bore;

thermally coupling the second end of the thermal conduit to a heat sink;

coupling the heat reservoir to the chassis; and thermally coupling the heat sink to the processor to enable the thermal conduit to provide heat transfer across a temperature gradient between the processor and the heat reservoir.

19. The method of claim 18, wherein heat flow between the processor and the heat reservoir through the thermal conduit is bi-directional.

20. The method of claim 18, further comprising drawing a partial vacuum on the inner bore such that the pressure within the thermal conduit is less than atmospheric pressure.

* * * * *